United States Patent [19]
Bauer et al.

[11] Patent Number: 5,748,546
[45] Date of Patent: *May 5, 1998

[54] SENSING SCHEME FOR FLASH MEMORY WITH MULTILEVEL CELLS

[75] Inventors: Mark E. Bauer, Cameron Park; Sanjay Talreja, Folsom; Kevin W. Frary, Fair Oaks; Gregory Atwood, San Jose; Albert Fazio, Los Gatos; Johnny Javanifard, Sacramento, all of Calif.

[73] Assignee: Intel Corporation, Santa Clara, Calif.

[*] Notice: The term of this patent shall not extend beyond the expiration date of Pat. No. 5,539,690.

[21] Appl. No.: 827,670

[22] Filed: Apr. 10, 1997

Related U.S. Application Data

[63] Continuation of Ser. No. 728,094, Oct. 9, 1996, abandoned, which is a continuation of Ser. No. 252,680, Jun. 2, 1994, abandoned.

[51] Int. Cl.$^6$ ........................................... G11C 7/00
[52] U.S. Cl. ................... 365/210; 365/184; 365/185.09; 365/189.07; 365/230.06
[58] Field of Search ............................. 365/210, 184, 365/207, 189.07, 168, 230.06, 185.03

[56] References Cited

U.S. PATENT DOCUMENTS

| | | | |
|---|---|---|---|
| 3,142,824 | 7/1964 | Hill | 340/173 |
| 3,505,655 | 4/1970 | Nystrom | 340/173 |
| 4,181,980 | 1/1980 | McCoy | 365/45 |
| 4,202,044 | 5/1980 | Beilstein, Jr. et al. | 365/182 |
| 4,287,570 | 9/1981 | Stark | 365/104 |
| 4,357,685 | 11/1982 | Daniele et al. | 365/189 |
| 4,388,702 | 6/1983 | Sheppard | 365/104 |
| 4,415,992 | 11/1983 | Adlhoch | 365/94 |
| 4,460,982 | 7/1984 | Gee et al. | 365/189 |
| 4,586,163 | 4/1986 | Koike | 365/104 |
| 4,653,023 | 3/1987 | Suzuki et al. | 354/104 |
| 4,701,884 | 10/1987 | Aoki et al. | 365/189 |
| 4,771,404 | 9/1988 | Mano et al. | 365/189 |
| 4,875,188 | 10/1989 | Jungroth | 365/185 |
| 4,890,259 | 12/1989 | Simko | 365/45 |
| 4,943,948 | 7/1990 | Morton et al. | 365/201 |
| 4,989,179 | 1/1991 | Simko | 365/45 |
| 5,012,448 | 4/1991 | Matsuoka et al. | 365/208 |
| 5,034,922 | 7/1991 | Burgess | 365/189.07 |
| 5,043,940 | 8/1991 | Harari | 365/168 |
| 5,053,990 | 10/1991 | Kreifels et al. | 364/900 |
| 5,095,344 | 3/1992 | Harari | 357/23.5 |
| 5,126,967 | 6/1992 | Simko | 365/45 |
| 5,163,021 | 11/1992 | Mehrotra et al. | 365/185 |
| 5,172,338 | 12/1992 | Mehrotra et al. | 365/185 |
| 5,200,920 | 4/1993 | Norman et al. | 365/185 |
| 5,218,569 | 6/1993 | Banks | 365/189.01 |
| 5,222,046 | 6/1993 | Kreifels et al. | 365/230.06 |
| 5,237,535 | 8/1993 | Mielke et al. | 365/218 |
| 5,260,901 | 11/1993 | Nagase et al. | 365/189.07 X |
| 5,262,984 | 11/1993 | Noguchi et al. | 365/185 |
| 5,283,761 | 2/1994 | Gillingham | 365/189.07 |
| 5,287,305 | 2/1994 | Yoshida | 365/189.01 |

(List continued on next page.)

FOREIGN PATENT DOCUMENTS

| | | |
|---|---|---|
| 0130614 | 1/1985 | European Pat. Off. . |
| 0 349 775 A2 | 1/1990 | European Pat. Off. . |
| 0409697 | 1/1991 | European Pat. Off. . |
| 2246022 | 9/1974 | France . |
| 1486912 | 9/1977 | Germany . |
| 56-60247 | 4/1981 | Japan . |
| WO/90/12400 | 10/1990 | WIPO . |
| 9212519 | 7/1992 | WIPO . |

*Primary Examiner*—Do Hyun Yoo
*Attorney, Agent, or Firm*—Blakely, Sokoloff, Taylor & Zafman

[57] ABSTRACT

Methods and apparatus for determining the state of a memory cell having more than two possible states are disclosed. For a first embodiment, the state of a flash cell having n states, where n is a power of 2, is determined by selectively comparing the threshold voltage $V_t$ of a selected memory cell to (n−1) reference voltages. For every two states, a single comparator is provided such that the total number of comparators is equal to the number of bits stored in the memory cell.

3 Claims, 9 Drawing Sheets

U.S. PATENT DOCUMENTS

| | | | |
|---|---|---|---|
| 5,289,406 | 2/1994 | Uramoto et al. | 365/104 |
| 5,289,412 | 2/1994 | Firary et al. | 365/189.01 X |
| 5,293,560 | 3/1994 | Harari | 365/185 |
| 5,297,148 | 3/1994 | Harari et al. | 371/10.2 |
| 5,305,273 | 4/1994 | Jinbo | 365/210 |
| 5,351,210 | 9/1994 | Saito | 365/189.01 |
| 5,361,343 | 11/1994 | Kosonocky et al. | 395/425 |
| 5,375,097 | 12/1994 | Reddy et al. | 365/230.06 |
| 5,388,064 | 2/1995 | Khan | 365/45 |
| 5,394,359 | 2/1995 | Kowalski | 365/185 |
| 5,440,505 | 8/1995 | Fazio et al. | 365/45 |
| 5,448,712 | 9/1995 | Kynett et al. | 395/430 |
| 5,450,363 | 9/1995 | Christopherson et al. | 365/205 |
| 5,463,757 | 10/1995 | Fandrich et al. | 395/430 |
| 5,497,354 | 3/1996 | Sweha et al. | 365/230.06 |
| 5,513,333 | 4/1996 | Kynett et al. | 395/430 |
| 5,515,317 | 5/1996 | Wells et al. | 395/427 |
| 5,537,350 | 7/1996 | Larsen et al. | 365/185.33 |
| 5,539,690 | 7/1996 | Talveja et al. | 365/185.22 |
| 5,566,125 | 10/1996 | Fazio et al. | 365/45 |
| 5,594,691 | 1/1997 | Bashir | 365/189.09 |

…

SENSING SCHEME FOR FLASH MEMORY WITH MULTILEVEL CELLS

This is a continuation of application Ser. No. 08/728,094, filed Oct. 9, 1996, now abandoned, which is a continuation of application Ser. No. 08/252,680, filed Jun. 2, 1994 now abandoned.

FIELD OF THE INVENTION

The present invention relates generally to determining the state of a semiconductor memory cell and specifically to sensing the state of a flash memory cell that stores more than a single bit of data.

BACKGROUND OF THE INVENTION

Nonvolatile semiconductor memory devices are fundamental building blocks in prior art computer system designs. The primary mechanism by which data is stored in nonvolatile memory is the memory cell. Typical prior memory technologies provide a maximum storage capacity of one bit, or two states, per cell. Semiconductor memory cells having more than two possible states are known in the prior art, and specific references are cited at the close of the Background of the Invention.

One type of prior nonvolatile semiconductor memory is the flash electrically-erasable programmable read-only memory ("flash EEPROM"). Prior art flash EEPROMs typically allow for the simultaneous reading of several flash cells. Further, typical prior flash EEPROMs have a storage capacity that is much greater than the amount of data that can be output at any one time. Accordingly, each output of a flash EEPROM is typically associated with an array of flash cells that is arranged into rows and columns, where each flash cell in an array is uniquely addressable. When a user provides an address, row and column decoding logic in the flash EEPROM selects the corresponding flash cell.

A typical prior flash memory cell is comprised of a single field effect transistor ("FET") including a select gate, a floating gate, a source, and a drain. Information is stored in the flash cell by altering the amount of charge on the floating gate, which causes the threshold voltage $V_t$ of the flash cell to be varied. The typical prior art flash memory cell is in one of two possible states, being either "programmed" or "erased." FIG. 1 illustrates flash cell distribution as a function of $V_t$ for a prior art flash device. As can be seen, the erased state and the programmed state each specify a range of $V_t$ voltages. The flash cell can theoretically possess a separate identifiable state for each electron that is added to the floating gate. Practically speaking, however, prior flash cells typically have only two possible states because of inconsistencies in flash cell structure, charge loss over time, thermal considerations and inaccuracies in sensing the charge on the floating gate that affect the ability to determine the data stored in the flash cell.

To distinguish between the two possible states, the states are separated by a separation range. According to one prior method, when a flash cell is read, the current conducted by the flash cell is compared to a current conducted by reference flash cell having a threshold voltage $V_t$ set to a predetermined reference voltage that is a voltage in the separation range. A single comparator typically makes the comparison and outputs the result.

When a flash cell is selected for reading, a biasing voltage is applied to the select gate. Simultaneously, the same biasing voltage is applied to the select gate of the reference cell. If the flash cell is programmed, excess electrons are trapped on the floating gate, and the threshold voltage $V_t$ of flash cell has increased such that the selected flash cell conducts less drain current than the reference flash cell. The programmed state of the prior flash cell is typically indicated by a logic 0. If the prior flash cell is erased, little or no excess electrons are on the floating gate, and the flash cell conducts more drain-source current than the reference cell. The erased state of the prior flash cell is typically indicated by a logic 1.

When a flash cell has three or more possible states, the prior art sensing schemes and circuits similar to that described above are inadequate. First, as a general rule, there must be at least (n−1) references for n states. This can be implemented as (n−1) reference cells. Thus, for three states, there must be two references. Typical prior art sensing schemes discriminate between two states and provide only one voltage reference. Second, the use of a single comparator in typical prior sensing schemes, without more, is not adequate to retrieve data from a multi-level flash cell.

U.S. Pat. No. 4,415,992 describes a sensing scheme for sensing the state of a memory cell capable of storing n states in which (n−1) comparators and (n−1) voltage references are used in parallel to determine the state of the memory cell. Each comparator compares a corresponding one of the (n−1) voltage references to a voltage determined by the drain-source current of the memory cell. Decoding logic is required to translate the outputs of the (n−1) comparators into (log2n) binary bits.

U.S. Pat. No. 5,163,021 describes a sensing scheme in which n comparators are sequentially used to compare the state of a memory cell capable of storing n states to a corresponding n references. Again, decoding logic is required to translate the outputs of the (n−1) comparators into (log2n) binary bits.

SUMMARY AND OBJECTS OF THE INVENTION

Therefore, one object of the present invention is to provide a method for determining the state of a memory cell having more than two possible states.

Another object of the present invention is to provide a circuit for determining the state of a memory cell having n possible states, wherein the circuit uses one comparator per bit stored in the memory cell.

A sensing circuit for determining a state of a memory cell having n possible states, where n is greater than 2, is described. The sensing circuit includes a first reference corresponding to a first threshold voltage level and a first comparator coupled to the memory cell and to the first reference. The first comparator compares a threshold voltage level of the memory cell to the first reference. The first comparator outputs a first result of the comparison. The sensing circuit further includes a second reference corresponding to a second threshold voltage level and a third reference corresponding to a third voltage level. A second comparator has one of its inputs coupled to the memory cell and its second input is selectively coupled to either the second reference or the third reference. A selector circuit selects between the second and third references in response to the first result. The selector circuit couples the second reference to the second comparator if the threshold voltage level of the memory cell is less than the first threshold voltage level. The selector circuit couples the third reference to the second comparator if the threshold voltage level of the memory cell is greater than the first voltage level.

The above-mentioned objects and other objects of the invention are also provided for by sensing circuit that includes a single comparator. A selector circuit selects between n−1 voltage references. At least two data latches are provided for storing and outputting the result of comparisons made between the cell voltage level and the voltage levels of selected voltage references.

Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Illustrative embodiments of the present invention relate to determining the state of a semiconductor memory cell having n possible states, wherein n is greater than two. According to one embodiment, a comparator is provided for every two states stored in the memory cell. In a second embodiment, a single comparator is used. Both embodiments implement a binary search method for selecting which of the (n−1) references are compared to the state of the memory cell.

Figure 1:
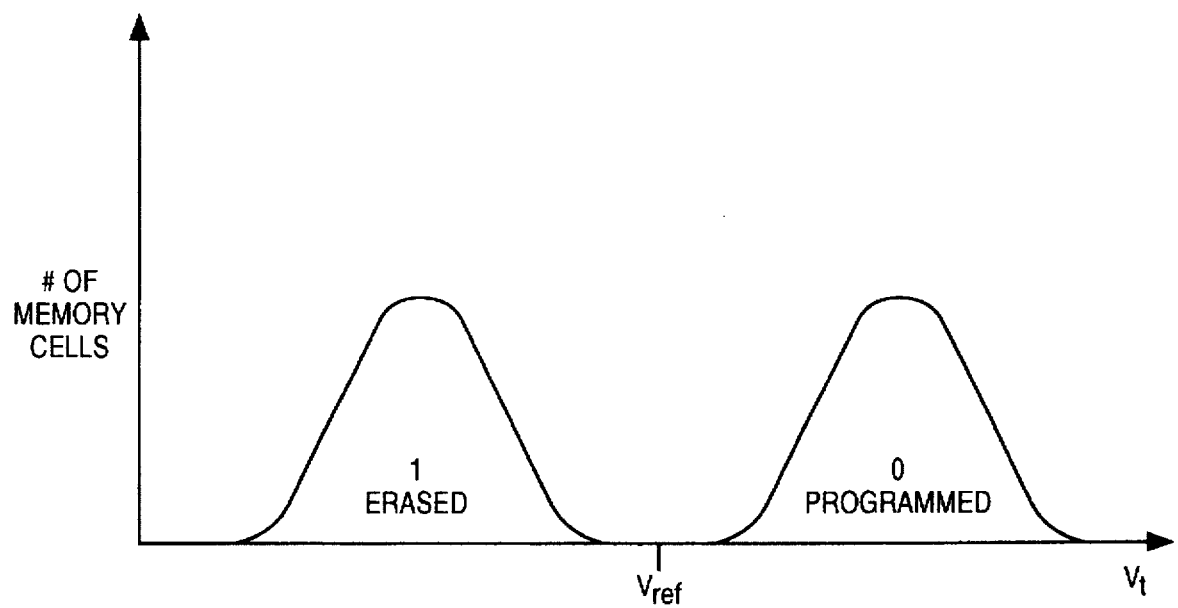
FIG. 1 illustrates flash cell distribution as a function of $V_T$ for a prior art flash device.
Figure 2:
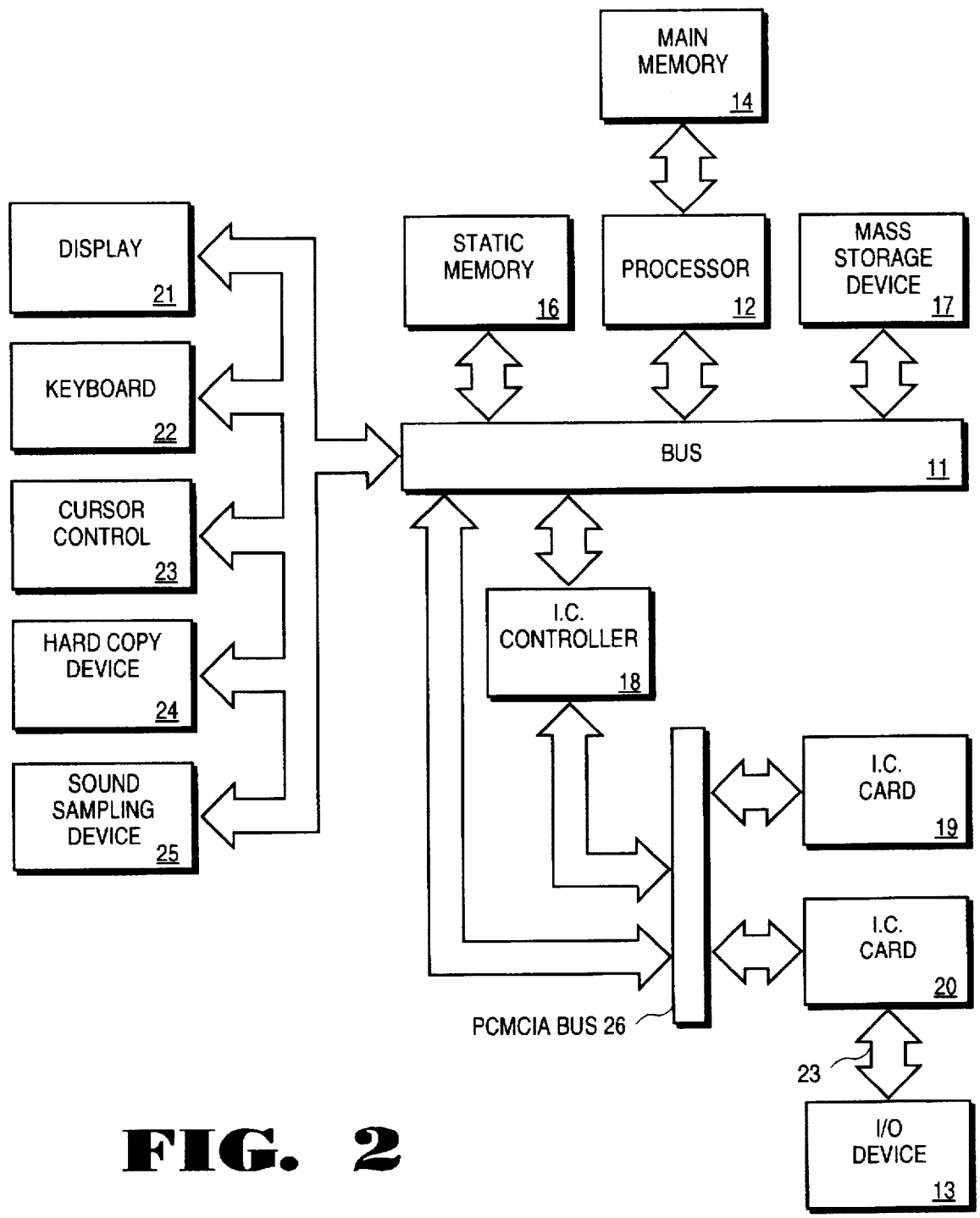
FIG. 2 is a block diagram of a computer system according to one embodiment.

FIG. 2 shows a computer system of one embodiment. The computer system generally includes a bus 11, to which may be coupled a processor 12, main memory 14, static memory 16, mass storage device 17, and integrated circuit controller 18. Static memory 16 may include a flash electrically eraseable programmable read only memory ("flash EEPROM") or other nonvolatile memory device that stores multiple bits of data per cell. Similarly, mass storage device 17 may be a solid state hard drive 17 using multiple bit per cell nonvolatile memory devices for storing data.

Integrated circuit cards 19 and 20 may be included in the computer system and are coupled to a Personal Computer Memory Card Industry (PCMCIA) bus 26. PCMCIA bus 26 is coupled to bus 11 and to integrated circuit (IC) controller 18 for providing communication information between cards 19 and 20 and the remainder of the computer system. IC controller 18 provides control and address information to IC cards 19 and 20 via PCMCIA bus 26 and is coupled to bus 11.

The computer system may further include a display device 21, a keyboard 22, a cursor control device 23, a hard copy device, and a sound sampling device 25. The specific components and configuration of the computer system is determined by the particular applications for which the computer system is to be used. For example, the computer system of FIG. 2 may be a personal digital assistant (PDA), a pen-based computer system, a mainframe computer, or a personal computer.

Figure 3:
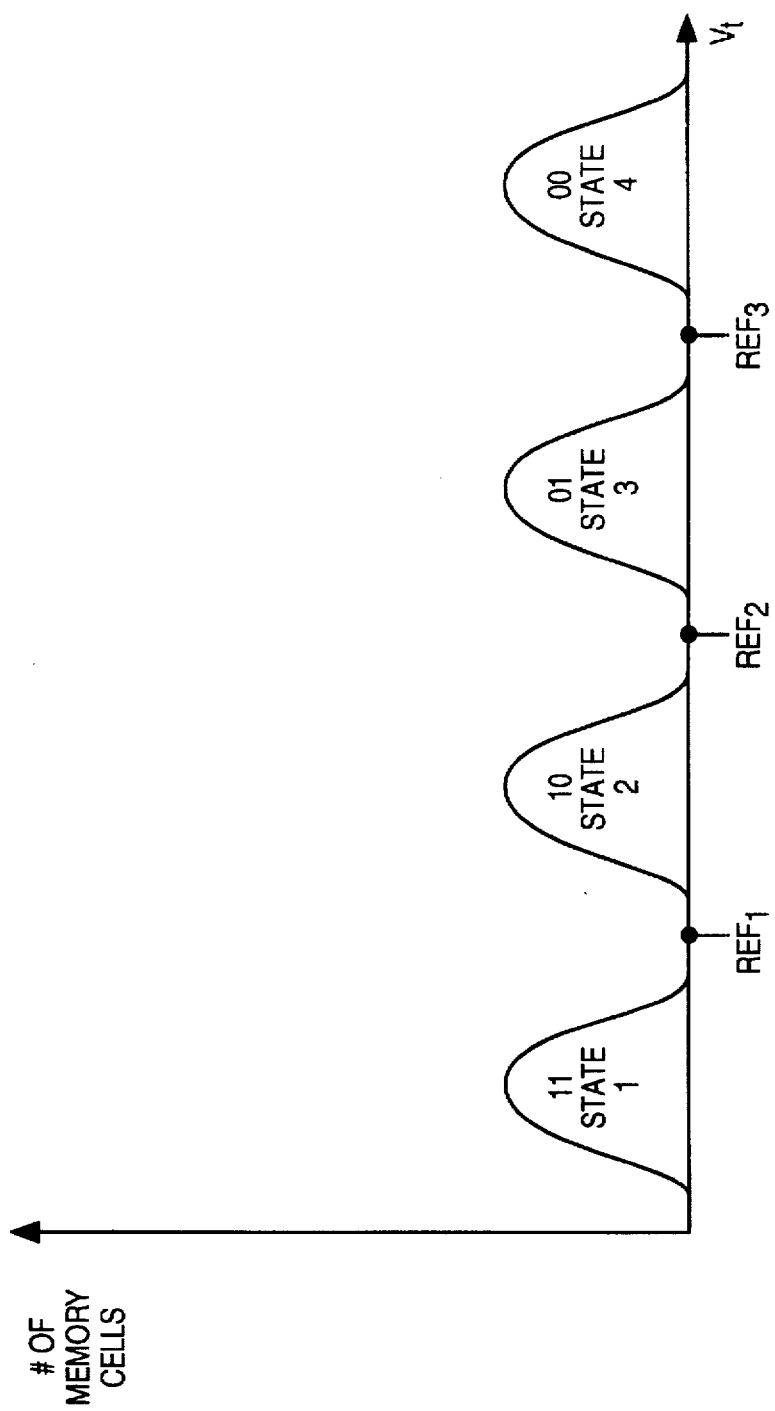
FIG. 3 illustrates a distribution of multi-level flash cells as a function of $V_T$ wherein each flash cell has four possible states.

For each embodiment, each memory cell is a flash cell. Each flash cell in the array is capable of being in one of four analog states, and the state of the flash cell is indicated by two binary bits. FIG. 3 shows a distribution of multi-level flash cells as a function of threshold voltage $V_t$. As can be seen, each state is separated by a separation range, and three references, $Ref_1$, $Ref_2$ and $Ref_3$, are provided, one each from the three separation ranges. The references are provided to distinguish between the analog states. State 1 encompasses the lowest range of $V_t$ voltages of the four states and is indicated by both bits being logic 1's (both erased). State 2 is indicated when the high order bit (Bit 1) is a logic 1 and the lower order bit (Bit 0) is a logic 0. State 3 is indicated by Bit 1 being a logic 0 and Bit 0 being a logic 1. State 4 is indicated by both bits being logic 0's (both programmed). The number n of possible states is not limited to four. For example, the number of states can be three, five, sixteen, etc. Further, the mapping of binary bits to analog states may be varied. For example, the lowest range of $V_t$ voltages can be indicated by both bits being logic 0's.

It should be noted that nonvolatile memory devices other than flash EEPROM's and volatile memory devices such as Dynamic Random Access Memories (DRAM) are capable of storing three or more analog states. Further, it should be noted that the analog states of nonvolatile devices having a floating gate may be expressed in terms other than the threshold voltage $V_t$. For example, analog states may be expressed as ranges of threshold voltages $V_t$ as shown in FIG. 3, as ranges of drain currents $I_D$, or as ranges of charge stored on the floating gate. Volatile memory cells such as DRAM memory cells are typically comprised of a capacitor and may similarly be expressed as ranges of charge, currents or voltages.

A nonvolatile memory cell that has a floating gate behaves as a field effect transistor having a threshold voltage $V_t$ that increases as charge is added to the floating gate. The memory cell drain current $I_D$ ("cell current") decreases as the threshold voltage $V_t$ and cell charge level increase. The memory cell threshold voltage $V_t$ is related to the memory cell drain current $I_D$ by the expression:

$$I_D \alpha G_m \times (V_G - V_t) \text{ for } V_D > V_G - V_t$$

$G_m$ is the transconductance of the memory cell;
$V_G$ is the memory cell gate voltage;
$V_D$ is the memory cell drain voltage; and
$V_t$ is the memory cell threshold voltage.

Given this relationship, there are a number of different ways to sense the amount of charge stored on of the floating gate of the memory cell, including: sensing the cell current of a memory cell when a constant voltage is applied to the select gate of the memory cell; sensing the amount of voltage required at the select gate to give rise to an expected cell current for the memory cell; sensing a voltage drop across a load that is coupled to the drain of the memory cell when a constant voltage is applied to the select gate of the memory cell, wherein the cell current determines the amount of the voltage drop across the load; and sensing the amount of voltage required at the select gate to give rise to an expected voltage drop across a load that is coupled to the drain of the memory cell. To determine the analog state of the memory cell, however, it is not necessary to quantify the precise amount of charge stored on the floating gate. It is sufficient to compare a characteristic of the memory cell to a known reference.

One type of reference is a reference memory cell programmed to have a known threshold voltage $V_t$ that is typically between defined states. Sensing circuitry for the memory cell may be replicated for the reference memory cell and the outputs of the sensing circuitry and reference sensing circuitry may be compared using a differential comparator. Because sensing the cell charge level of a memory cell typically requires the comparison of either voltages or currents, the reference may be provided by using voltage supplies or current sources to supply voltages or currents that correspond to reference memory cells having a cell charge level between defined analog states. For this reason, the references $Ref_1$, $Ref_2$, and $Ref_3$ are not specified as being threshold voltages, cell currents, or levels of charge stored on a floating gate. Instead, it is to be understood that the references shown in FIG. 3 correspond to the characteristics of the memory cell as defined by the relationship between cell charge level, cell current $I_D$, and threshold voltage $V_t$. For the purposes of simplifying the remaining discussion, the references $Ref_1$, $Ref_2$, and $Ref_3$ will expressed as threshold voltages $V_{R1}$, $V_{R2}$ and $V_{R3}$, respectively.

Figure 4A:
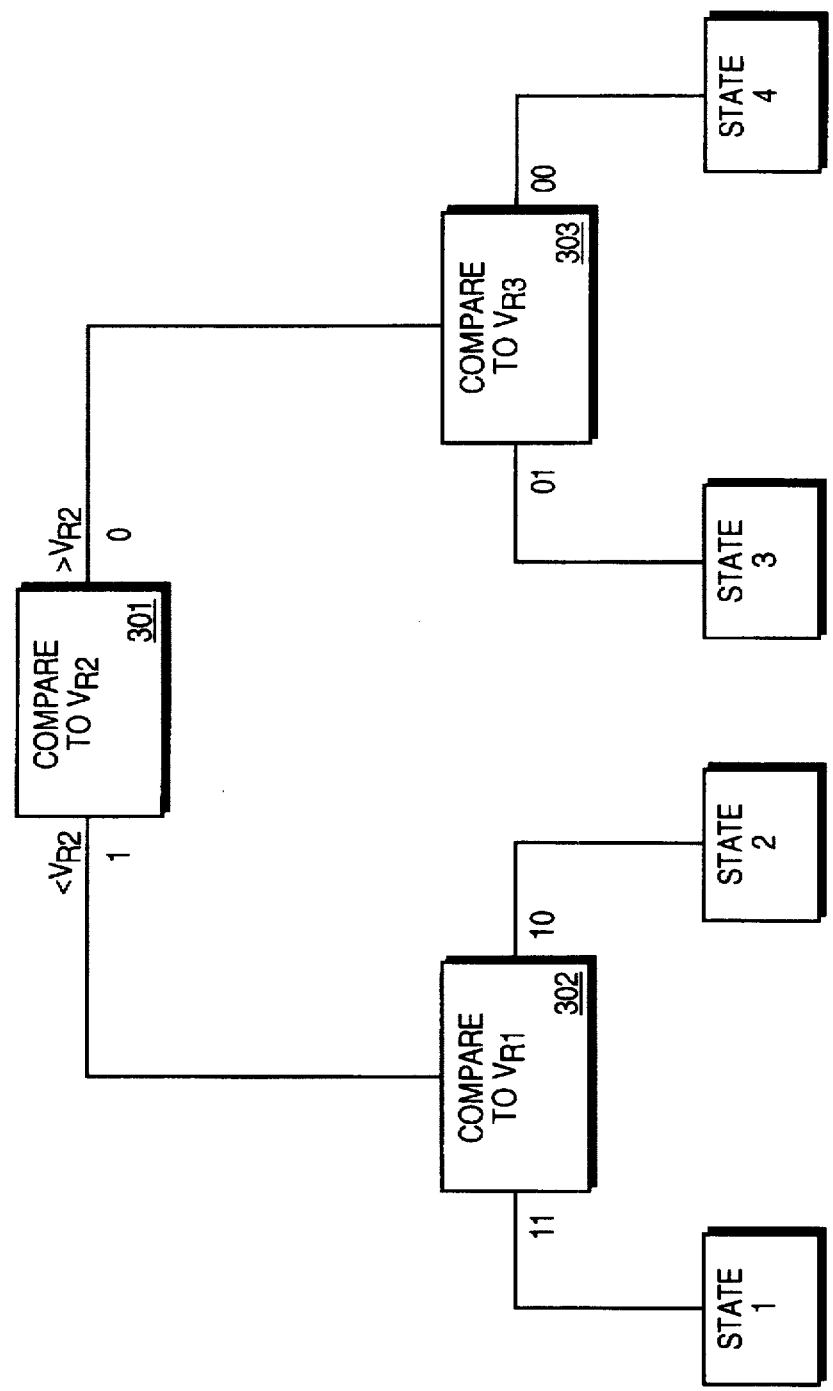
FIG. 4A shows a flow chart for performing a binary search of reference cells for a flash cell having four possible states.

FIG. 4A is a block diagram showing a binary search method for determining the state of a memory cell having more than two possible states. In step 301, the cell charge level of the selected cell is sensed and compared to a first reference flash cell having its $V_t$ equal to $V_{R2}$. Depending on the result of the initial comparison, the sensed cell charge level of the selected cell is compared to a selected one of a second reference flash cell having its $V_t$ equal to $V_{R1}$ and a third reference flash cell having its $V_t$ equal to $V_{R3}$. If the sensed cell charge level of the selected flash is less than that of the first reference flash cell, the sensed cell charge level is compared to the second reference flash cell at step 2, and the selected flash cell is either in state 1 or state 302. If the sensed cell charge level of the selected flash is greater than that of the first reference flash cell, the sensed cell charge level is compared to the third reference flash cell at step 303, and the selected flash cell is either in state 3 or state 4. Sensing of the cell charge level may be done according to any of the methods previously discussed.

Figure 4B:
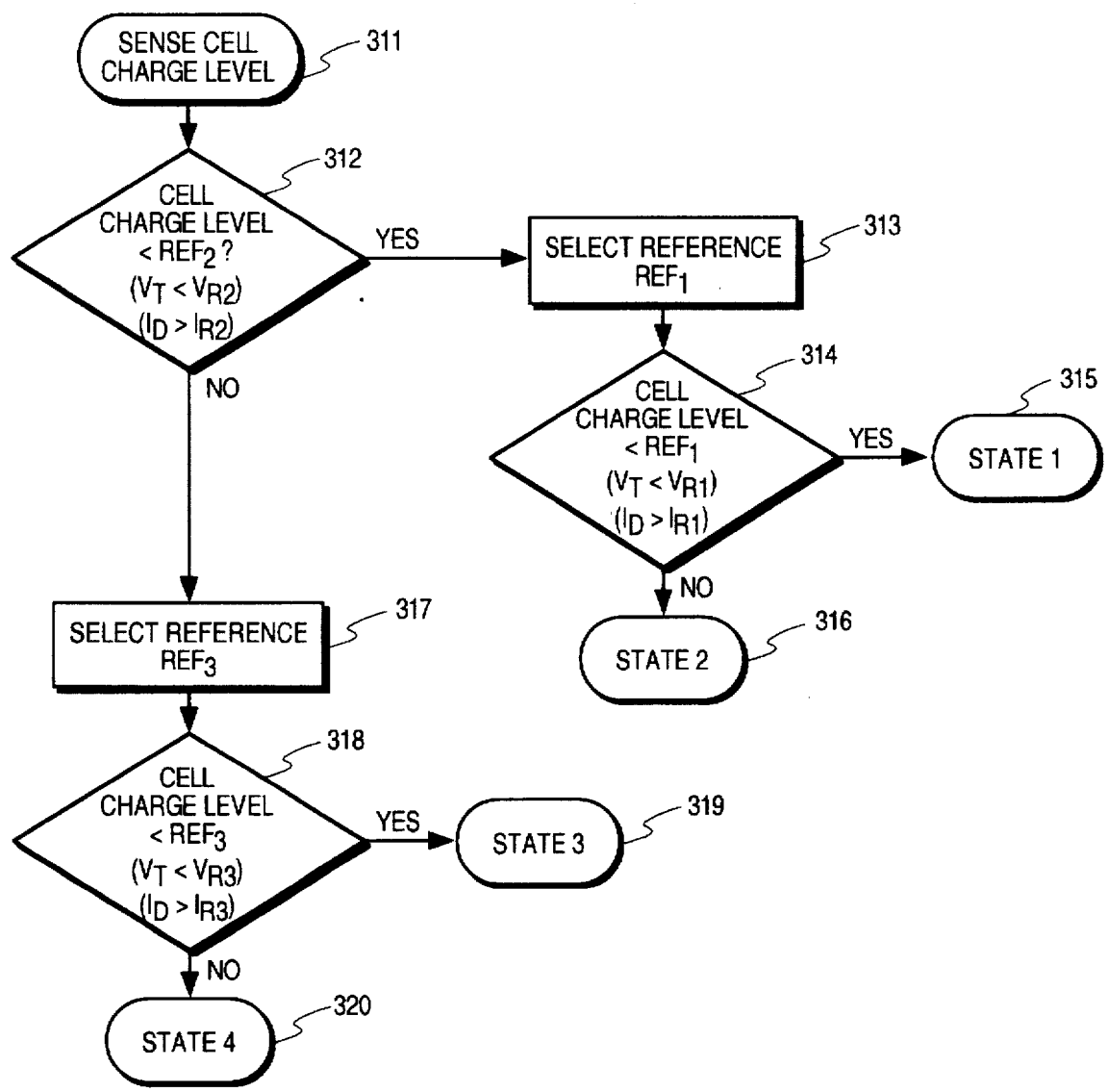
FIG. 4B is a more conventional flow chart of the binary search method.

FIG. 4B is a conventional flow chart showing the binary search method of the present embodiment. At step 311, the cell charge level of the memory cell is sensed. At step 312, it is determined whether the cell charge of the memory cell is less than the cell charge level of the reference $Ref_2$. If the cell charge level of the memory cell is less than the cell charge level of the reference $Ref_2$, the threshold voltage $V_t$ of the memory cell is less than that of a reference memory cell having a $V_t$ equal to $V_{R2}$. Similarly, the cell current $I_D$ of the memory cell is greater than the cell current $I_{R2}$ of a reference memory cell having a cell current of $I_{R2}$. If the cell charge level of the memory cell is less than the cell charge level of reference $Ref_2$, $Ref_1$ is selected at step 313. At step 314, it is determined whether the cell charge of the memory cell is less than the cell charge level of the reference $Ref_1$. If the cell charge level of the memory cell is less than the cell charge level of the reference $Ref_1$, the memory cell is indicated as being in state 1 at step 315. If the cell charge level of the memory cell is greater than the cell charge level of the reference $Ref_1$, the memory cell is indicated as being in state 2 at step 316.

If the cell charge level of the memory cell is less than the cell charge level of reference $Ref_2$, $Ref_3$ is selected at step 317. At step 318, it is determined whether the cell charge of the memory cell is less than the cell charge level of the reference $Ref_3$. If the cell charge level of the memory cell is less than the cell charge level of the reference $Ref_3$, the memory cell is indicated as being in state 3 at step 319. If the cell charge level of the memory cell is greater than the cell charge level of the reference $Ref_3$, the memory cell is indicated as being in state 4 at step 320.

Figure 5:
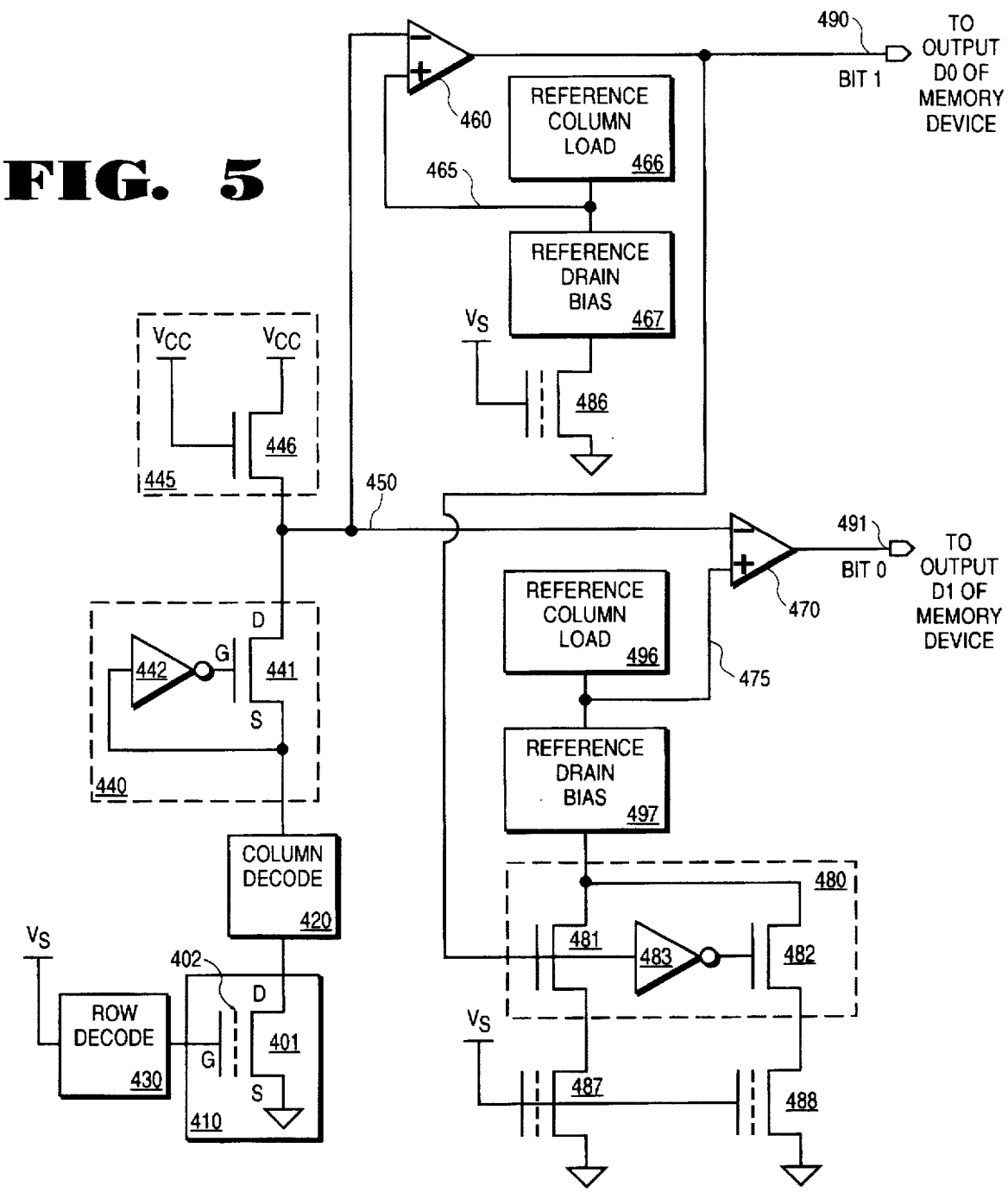
FIG. 5 illustrates a sensing circuit using two comparators for sensing the state of a flash cell having four possible states.

FIG. 5 shows a sensing circuit for determining the state of a memory cell having more than two possible states. This circuit implements the method of FIGS. 4A–4B. The circuit uses a constant-gate-voltage/variable-cell-current sensing scheme wherein a constant biasing voltage $V_S$ is applied to the select gates of a selected flash cell 401 and reference flash cells 486, 487 and 488. The state of the selected flash cell 401, as a function of the level of charge on floating gate 142 of the flash cell 141, is determined by comparing the cell current of the selected flash cell 401 to the reference cell currents of a reference flash cell 486 and a selected one of the reference flash cells 487 and 488. To sense the respective cell currents, a load is coupled to the drains of the respective flash cells to give rise to a voltage drop. In this manner, the cell charge level of the selected flash cell is sensed and used to determine the analog state of the selected flash cell.

The multi-level flash cell 401 of the present embodiment includes a select gate, a floating gate 402, a drain and a source. The selected flash cell 401 is one of an array 410 of such multi-level flash cells arranged in a matrix of rows and columns. The selected flash cell 401 is selected when column decoder 420 and row decoder 430 select the selected flash cell 401 in response to a user-provided address. When the selected flash cell 401 is selected, a biasing voltage $V_S$ is applied to the select gate of flash cell 401 and the drain of flash cell 401 is coupled to the drain bias circuit 440 via column decoder 420. It will be understood that several flash cells of the array 410 can be concurrently selected in a similar manner such that multiple bits of data may be read simultaneously. Accordingly, each selected cell would be coupled to sensing circuitry similar to that shown in FIG. 5.

The cell charge level on the floating gate 402 of the selected flash cell 401 determines the amount of cell current that flows through selected flash cell 401 when the biasing voltage $V_S$ is applied to the select gate of selected flash cell 401 by defining the cell threshold voltage $V_t$. When the selected flash cell 401 is conducting current, a corresponding current is produced across the column load 445, resulting in a voltage drop from VCC to the node 450. The voltage at node 450 is sensed by the differential comparators 460 and 470 used to determine the state of the flash cell 401.

In FIG. 5, the column load 445 is shown as an n-channel FET 446 coupled as a resistor having its source coupled to node 450, its drain coupled to VCC and its gate coupled to a constant voltage $V_{CL}$. The constant voltage $V_{CL}$ is preferably such that the FET 446 operates in the saturated region. Alternatively, the column load may be a resistor. A drain bias circuit 440 is also coupled between the array 410 and node 450. The function of the drain bias circuit 440 is to isolate the column load 445 from the drain of the selected flash cell 401 while biasing the drain of the selected flash cell 401. The drain bias circuit includes an n-channel FET 441 having its drain coupled to node 450, its source coupled to the selected flash cell 401 via the column decode 420, and its gate coupled to the output of an inverter 442 which has an input coupled to the source of FET 441. Alternatively, the n-channel FET 441 may be coupled as a static gate cascode.

The voltage at node 450 is a function of the drain-source current of the selected flash cell 401. In turn, the cell current of the selected flash cell 401 is a function of the amount of charge on the floating gate 402. As $V_t$ increases, the cell current decreases. Similarly, the cell current increases as $V_t$ decreases. Thus, if the selected flash cell 401 is in state 1, the voltage at node 450 is less than if the selected flash cell 401 is in state 2.

In this circuit, comparators 460 and 470 determine the state of the selected flash cell 401 by comparing the voltage at node 450 to the voltages at reference nodes 465 and 475, respectively. In this embodiment, the voltage at reference node 465 is determined by a reference flash cell 486 that has a $V_t$ set to $V_{R2}$. Thus, the voltage at reference node 465 is greater than the voltage at node 450 if the selected flash cell 401 is programmed to state 1 or state 2. The voltage at node 465 is less than the voltage at node 450 if the selected flash cell 401 is programmed to state 3 or state 4. The reference flash cell 486 has its source coupled to ground, its gate coupled to the biasing voltage $V_S$, and its drain coupled to a reference drain bias circuit 467, which is preferably identical to the drain bias circuit 440. The drain bias circuit 467 is coupled to a reference column load circuit 466, which is preferably identical to column load 445. For the comparator 470, the voltage at reference node 475 is determined by a selected one of reference flash cells 487 and 488 having $V_t$s equal to $V_{R1}$ and $V_{R3}$, respectively. Reference node 475 is similarly coupled to a reference column load 496 and a reference drain bias 497.

There are a number of different ways for providing a reference voltage to sense the state of the selected flash cell. For example, one scheme is to provide two reference cells having different threshold voltages $V_t$ with their drains coupled together. Two identical column load circuits are coupled in parallel to the drains of the two reference cells at the reference node. Assuming that the same voltage is applied to the select gates of the reference cells, the voltage at the reference node is equivalent to a single reference cell having a cell current equal to the average of the cell currents of the two reference cells multiplied by the resistance of a single column load circuit. Also, the voltage reference may be generated using a single reference cell with its gate driven to one of (n−1) different values by a digital-to-analog converter. For a further discussion of one reference circuit, see U.S. Pat. No. 5,289,412, of Frary et al., and commonly assigned to Intel Corporation of Santa Clara, Calif.

Additionally, the current across the reference column load 466 may be produced by circuits other than reference flash cells. For example, a constant current source or current mirror may be used. The use of current mirror circuits in conjunction with an array of reference flash cells provides the needed reference currents for sensing multiple flash cells simultaneously without having to reproduce the array of reference flash cells for each output of the memory device.

The negative terminals of comparators 460 and 470 are both coupled to node 450 for sensing the voltage resulting from applying the biasing voltage $V_S$ to the select gate of the selected flash cell 401. Comparator 460 has its positive terminal coupled to reference node 465. The positive terminal of comparator 470 is coupled to reference node 475. The selection between the reference flash cells 487 and 488 is made in response to the output of comparator 460. A selector circuit 480 is coupled between the output signal line 490 of the comparator 460 and the first and second reference cells.

The selector circuit 480 includes a first n-channel FET 481 coupled between the drain bias circuit 497 and the reference flash cell 487, and a second n-channel FET 482 coupled between the drain bias circuit 497 and the reference flash cell 488. The signal line 490, which is the output of the comparator 460, is coupled to the gate of FET 481. An inverter 483 is coupled between the output signal line 490 and the gate of FET 482. If the output of the first comparator 460 is a logic 1, indicating that the selected flash cell 401 has a lower $V_t$ than the reference flash cell 486, the first FET 481 is switched on, and the second comparator 470 is coupled to the reference flash cell 487. If the output of the first comparator 460 is a logic 0, the inverter inverts the output to switch the FET 482 on, coupling the second comparator 470 to the reference flash cell 488. The second comparator 470 outputs the result of the second comparison via output signal line 491. For this embodiment, the output signal line 490 outputs the high order bit Bit 1 and the output signal line 491 outputs the low order bit Bit 0. In this manner, no decoding logic is necessary as the outputs of the comparators 460 and 470 correspond directly to the state of the selected flash cell 401. Output signal lines 490 and 491 may thus be mapped directly to the outputs of a memory device such that both bits of the selected flash cell 401 are read out in a parallel fashion.

The sensing circuit of this embodiment is especially useful when the number n of possible states is a power of two, i.e. when (log2 n) is an integer, because the circuit is configured to perform a binary search. When n is equal to 4 the threshold voltage $V_t$ of the first reference cell is preferably in the separation range between the (n/2) state and the (n/2+1) state. If the threshold voltage $V_t$ of the first reference cell is greater than the threshold voltage $V_t$ of the selected flash cell, the threshold voltage $V_t$ of the second reference cell is preferably in the separation range between the (n/4) state and the (n/4+1) state. If the threshold voltage $V_t$ of the first reference cell is less than the threshold voltage $V_t$ of the selected flash cell, the threshold voltage $V_t$ of the second reference cell is preferably in the separation range between the (3n/4) state and the ((3n/4)+1)) state. For each additional bit stored per cell, a single comparator is preferably added and the selector circuit is modified.

Figure 6:
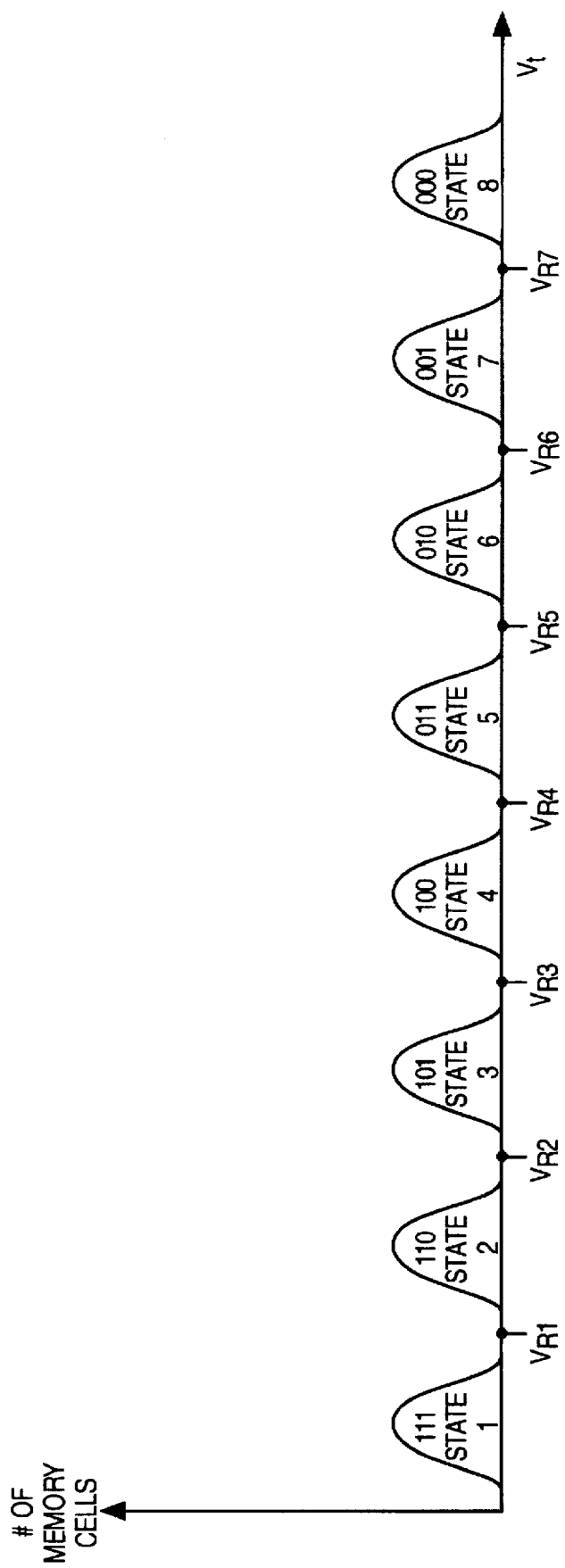
FIG. 6 illustrates a distribution of multi-level flash cells as a function of $V_T$ wherein each flash cell has eight possible states.
Figure 7:
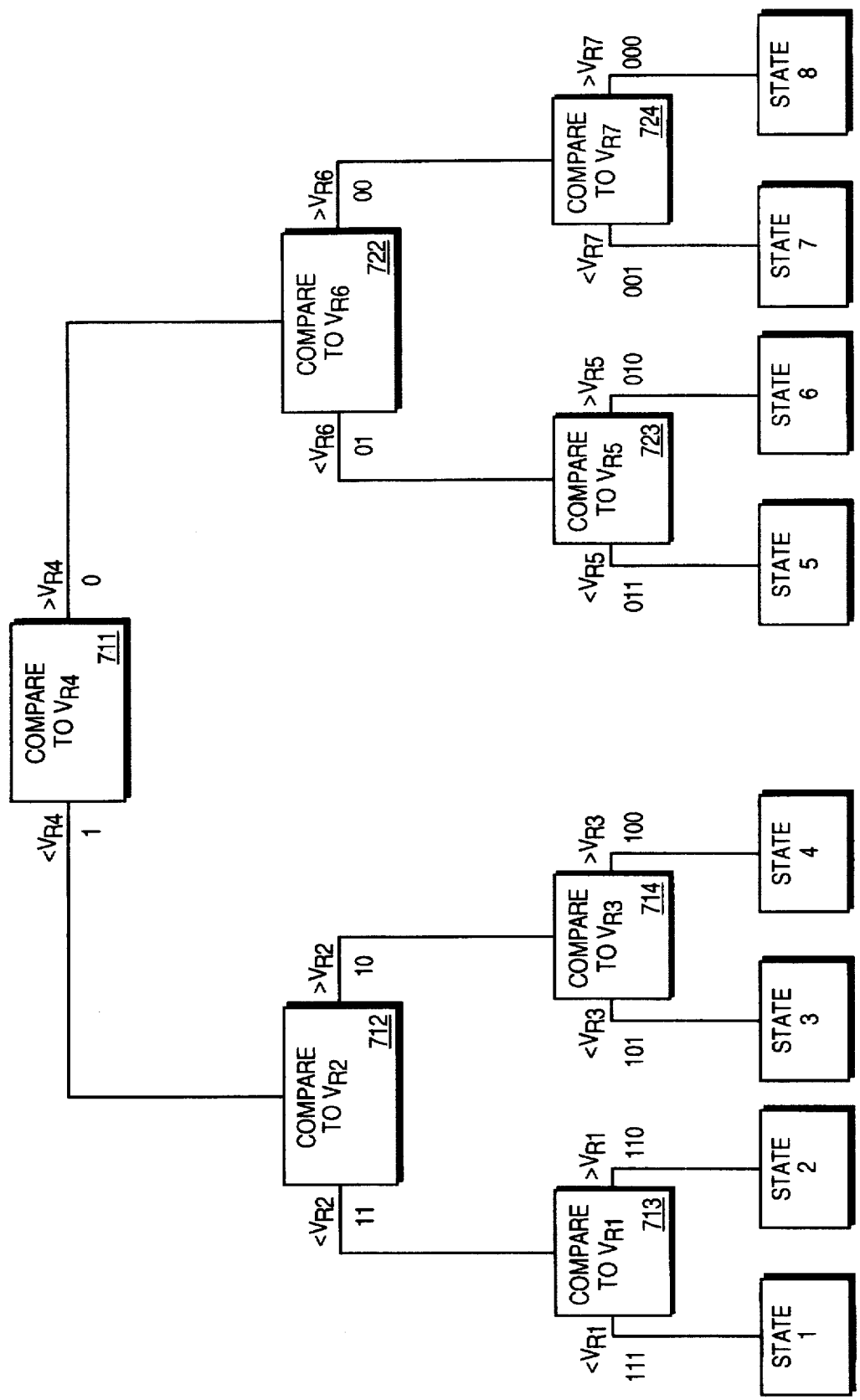
FIG. 7 shows a flow chart for performing a binary search of reference cells for a flash cell having eight possible states.

When n is equal to 8, 16, 32, etc., the selection of reference cells continues in a similar manner, the remaining states being bisected until the states of all bits stored in the flash cell are determined. FIG. 6 is a distribution of flash cells versus $V_t$ for a flash device capable of having eight states. FIG. 7 shows a flow chart for a binary search when the number of states is equal to 8. According to FIG. 7, the binary search of the eight reference cells begins at step 711 with the initial comparison of the cell charge level of the selected cell to the cell charge level of a first reference cell having a $V_t$ equal to $V_{R4}$. If the sensed cell charge level is less than that of the first reference cell, the search continues in steps 712, 713 and 714 as described in steps 301, 302 and 303 of FIG. 4A. If the sensed cell charge level is greater than that of the first reference cell, the search continues as shown in steps 722, 723 and 724. Each state is represented by three binary bits.

Figure 8:
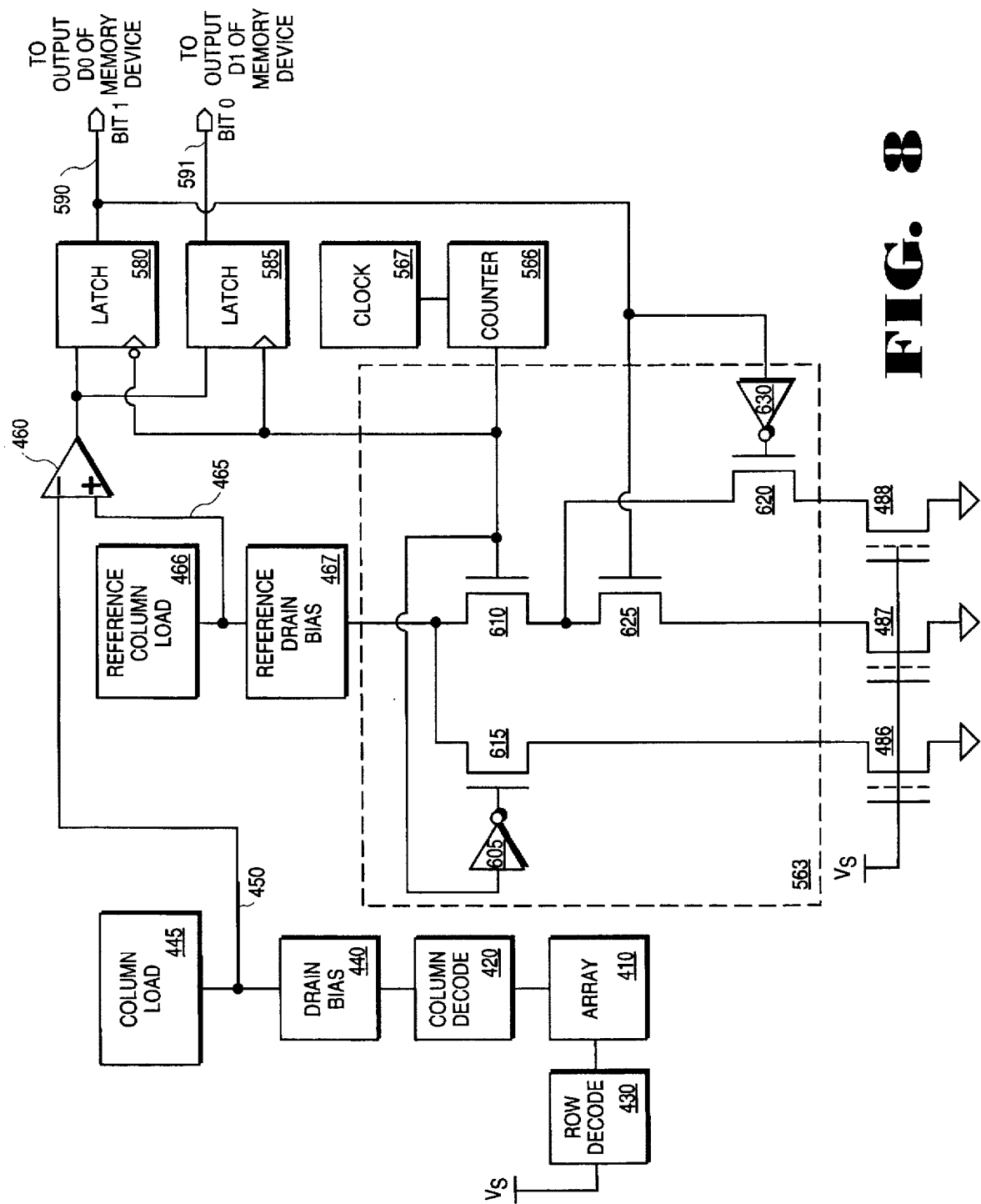
FIG. 8 shows a sensing circuit utilizing a single comparator to determine the state of a flash cell having four possible states.

FIG. 8 illustrates a sensing circuit utilizing a single comparator to determine the state of a flash cell having four possible states. Unlike the first embodiment, this embodiment is a synchronous circuit. Like the first embodiment, the negative terminal of comparator 460 is coupled to node 450, and the positive terminal of comparator 460 is coupled to reference node 465. A decode circuit 563 determines which one of the three reference flash cells 486, 487, and 488 is to be coupled to the reference drain bias circuit 467. When the number of states is equal to four, the counter 566 starts with a count of 0 and has a maximum count of one. The maximum count is increased by one for each additional bit of data stored in a flash cell. For a three bit cell, the maximum count would be two. The clock generator 567 provides a clock signal to the counter 566, which increases its count by one, each clock cycle. The frequency of the clock generator may be determined by methods that are well-known in the art.

The decode circuit 563 has the output of the counter 566 and the output of the first latch 580 as inputs. An exemplary truth table for the decode circuit 563 is illustrated in Table 1. The FETs 610, 615, 620 and 625, along with the inverters 605 and 630, implement the truth table of Table 2, which is a binary search similar to that shown in FIGS. 4A–4B.

TABLE 1

| COUNT | FIRST RESULT | $V_{REF}$ |
|---|---|---|
| 0 | X | $V_{R2}$ |
| 1 | 1 | $V_{R1}$ |
| 1 | 0 | $V_{R3}$ |

During a read operation, the counter is initialized to 0 such that the drain bias 467 is coupled to reference flash cell 486. The reference flash cell 486 has a threshold voltage $V_t$ equal to $V_{R2}$. The result of the first comparison is stored in latch 580. The first result is output by the latch 580 via signal line 590, which is fed back to the decoding circuit 563. If the first result is a logic 1, the reference flash cell 487, which has a threshold voltage $V_t$ equal to $V_{R1}$, is selected, and the voltage at node 465 is compared to the voltage at node 450. If the first result is a logic 0, the reference flash cell 488 having a threshold voltage $V_t$ equal to $V_{R3}$ is selected. The second result is output by the comparator 460 and stored in the latch 585. The second result is output by the latch 585 via signal line 591. Output signal line 590 outputs the high order bit Bit 1, and output signal line 591 outputs the low order bit Bit 0.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than restrictive sense.

What is claimed is:

1. In a flash memory device including at least one flash electrically-erasable programmable read-only memory (EEPROM) cell having n bits indicative of $2^n$ states, each state corresponding to a predetermined range of cell charge levels, a method for determining a state of the flash EEPROM cell, the method comprising the steps of:

a) sensing a cell charge level of the flash EEPROM cell;

b) comparing using a first comparator the cell charge level of the flash EEPROM cell and a reference cell charge level of a selected first reference cell;

c) outputting from the first comparator a result of step b) indicative of a first one of the n bits in the flash EEPROM cell;

d) supplying the result of step b) to an input of a selector circuit, the selector circuit selecting one of a second reference cell and a third reference cell, wherein selection between the second and third reference cells is done in response to the result of step b), the second reference cell being selected if the cell charge level of the flash EEPROM cell is less than the reference cell charge level of the selected first reference cell, and the third reference cell being selected if the cell charge level of the flash EEPROM cell is greater than the reference cell charge level of the selected first reference cell;

e) comparing using a second comparator the cell charge level of the flash EEPROM cell to the selected one of a reference cell charge level of the second reference cell and a reference cell charge level of the third reference cell; and f) outputting from the second comparator a result of step e) indicative of a second one of the n bits of the flash EEPROM cell wherein the first comparator continues to output the result of step b) while steps d), e), and f) are performed such that the first comparator outputs the first one of the n bits and the second comparator outputs the second one of the n bits simultaneously to indicate the state of the flash EEPROM cell.

2. The method as described in claim 1 further comprising the steps of:

g) in response to a result of step f), selecting one of a fourth reference cell and a fifth reference cell, the fourth reference cell being selected if the cell charge level of the flash EEPROM cell is a first value and the fifth reference cell being selected if the cell charge level of the flash EEPROM cell is a second value;

h) comparing the cell charge level of the flash EEPROM cell and a reference cell charge level of the selected one of the fourth and fifth reference cells; and i) outputting a result of step h) indicative of a third one of the n bits in the flash EEPROM cell wherein the first and second comparators continue to output the results of steps b) and f), respectively, while steps g), h), and i) are performed, such that the first comparator outputs the first one of the n bits and the second comparator outputs the second one of the n bits simultaneously with the third one of the n bits to indicate the state of the flash EEPROM cell.

3. In a flash memory device including at least one flash electrically-erasable programmable read-only memory (EEPROM) cell having n bits indicative of $2^n$ states, each state corresponding to a predetermined range of cell charge levels, a method for determining a state of the flash EEPROM cell, the method comprising the steps of:

a) sensing a cell charge level of the flash EEPROM cell;

b) comparing using a comparator the cell charge level of the flash EEPROM cell and a reference cell charge level of a selected first reference cell in a decode circuit;

c) outputting from the comparator a result of step b) indicative of a first one of the n bits in the flash EEPROM cell;

d) supplying the result of step b) to an input of the decode circuit, the decode circuit selecting one of a second reference cell and a third reference cell in response to the result of step b), the second reference cell being selected if the cell charge level of the flash EEPROM cell is less than the reference cell charge level of the selected first reference cell, and the third reference cell being selected if the cell charge level of the flash EEPROM cell is greater than the reference cell charge level of the selected first reference cell;

e) comparing using the comparator the cell charge level of the flash EEPROM cell to the selected one of a reference cell charge level of the second reference cell and a reference cell charge level of the third reference cell; and f) outputting from the comparator a result of step e) indicative of a second one of the n bits of the flash EEPROM cell wherein the result of step b) and the result of step e) indicate the state of the flash EEPROM cell.

* * * * *